US010641817B2

(12) United States Patent
Chou et al.

(10) Patent No.: US 10,641,817 B2
(45) Date of Patent: May 5, 2020

(54) MOTOR DRIVING DEVICE AND MEASURING METHOD

(71) Applicant: FANUC CORPORATION, Yamanashi (JP)

(72) Inventors: Norihiro Chou, Yamanashi-ken (JP); Youichirou Ooi, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/199,752

(22) Filed: Nov. 26, 2018

(65) Prior Publication Data

US 2019/0162773 A1 May 30, 2019

(30) Foreign Application Priority Data

Nov. 28, 2017 (JP) .................................. 2017-227488

(51) Int. Cl.
*G01R 31/34* (2020.01)
*H02P 5/00* (2016.01)
(Continued)

(52) U.S. Cl.
CPC ........... *G01R 31/14* (2013.01); *G01R 31/025* (2013.01); *H02M 5/458* (2013.01); *G01R 27/025* (2013.01);
(Continued)

(58) Field of Classification Search
CPC ................ G01R 31/343; G01R 31/346; G01R 31/1227; G01R 27/08; G01R 27/025;
(Continued)

(56) References Cited

U.S. PATENT DOCUMENTS

| 7,898,264 B2 * | 3/2011 | Horikoshi .......... G01R 31/1263 324/547 |
| 8,022,658 B2 * | 9/2011 | Ide ..................... G01R 31/1227 318/802 |

(Continued)

FOREIGN PATENT DOCUMENTS

| JP | 61105470 A | 5/1986 |
| JP | 2001141795 A | 5/2001 |

(Continued)

OTHER PUBLICATIONS

English Abstract for Japanese Publication No. 2015-169479 A, published Sep. 28, 2015, 2 pgs.

(Continued)

*Primary Examiner* — Minh N Tang
(74) *Attorney, Agent, or Firm* — Fredrikson & Byron, P.A.

(57) ABSTRACT

A motor driving device includes: a converter unit having a capacitor; a plurality of inverter units having a plurality of semiconductor switching elements and configured to convert a capacitor voltage across the capacitor into an AC voltage to drive a plurality of motors; a second switch configured to connect the negative-side terminal of the capacitor to ground; a first detector configured to detect a ground-referenced voltage; and a second detector configured to detect the capacitor voltage. The motor driving device controls the semiconductor switching elements to establish a measurement state for enabling measurement of an insulation resistance of a measurement target motor, determines that the ground-referenced voltage has converged when an amount of change in the waveform of the ground-referenced voltage detected by the first detector becomes equal to or lower than a threshold, and calculates the insulation resis- (Continued)

tance based on the ground-referenced voltage and the capacitor voltage.

4 Claims, 8 Drawing Sheets

(51) Int. Cl.
    *G01R 31/14*     (2006.01)
    *G01R 31/02*     (2006.01)
    *H02M 5/458*     (2006.01)
    *H02P 5/74*     (2006.01)
    *G01R 27/18*     (2006.01)
    *G01R 27/02*     (2006.01)
    *H02M 1/00*     (2006.01)

(52) U.S. Cl.
    CPC ............ *G01R 27/18* (2013.01); *G01R 31/346* (2013.01); *H02M 2001/008* (2013.01); *H02P 5/74* (2013.01)

(58) Field of Classification Search
    CPC . G01R 27/18; H02P 5/00; H02P 27/04; H02P 27/06
    See application file for complete search history.

(56) References Cited

U.S. PATENT DOCUMENTS

| | | | |
|---|---|---|---|
| 2015/0256116 A1 | 9/2015 | Tateda et al. | |
| 2016/0377670 A1 | 12/2016 | Tamida et al. | |

FOREIGN PATENT DOCUMENTS

| | | | |
|---|---|---|---|
| JP | 2004347610 A | 12/2004 | |
| JP | 2007315981 A | 12/2007 | |
| JP | 2008139249 A | 6/2008 | |
| JP | 2008157750 A | 7/2008 | |
| JP | 2010210510 A | 9/2010 | |
| JP | 201481267 A | 5/2014 | |
| JP | 2015169479 A | 9/2015 | |
| JP | 2017173263 A | 9/2017 | |
| WO | 2015076075 A1 | 3/2017 | |

OTHER PUBLICATIONS

English Abstract for Japanese Publication No. JPWO2015/076075 A1, published Mar. 16, 2017, 1 pg.
English Abstract and Machine Translation for Japanese Publication No. 2010-210510 A, published Sep. 24, 2010, 7 pgs.
English Abstract and Machine Translation for Japanese Publication No. 2007-315981 A, published Dec. 6, 2007, 10 pgs.
English Abstract and Machine Translation for Japanese Publication No. 61-105470 A, published May 23, 1986, 7 pgs.
English Abstract and Machine Translation for Japanese Publication No. 2017-173263 A, published Sep. 28, 2017, 22 pgs.
English Abstract and Machine Translation for Japanese Publication No. 2014-081267 A, published May 8, 2014, 15 pgs.
English Abstract and Machine Translation for Japanese Publication No. 2008-157750 A, published Jul. 10, 2008, 8 pgs.
English Abstract and Machine Translation for Japanese Publication No. 2001-141795 A, published May 25, 2001, 8 pgs.
English Abstract and Machine Translation for Japanese Publication No. 2004-347610 A, published Dec. 9, 2004, 8 pgs.
English Abstract and Machine Translation for Japanese Publication No. 2008-139249 A, published Jun. 19, 2008, 15 pgs.
Untranslated Decision to Grant a Patent mailed by Japan Patent Office (JPO) for Application No. 2017-227488, dated Sep. 10, 2019, 3 pgs.
English Machine Translation of Decision to Grant a Patent mailed by Japan Patent Office (JPO) for Application No. 2017-227488, dated Sep. 10, 2019, 2 pgs.
Untranslated Notice of Reasons for Refusal mailed by Japan Patent Office (JPO) for Application No. 2017-227488, dated Jul. 2, 2019, 6 pgs.
English Machine Translation of Notice of Reasons for Refusal mailed by Japan Patent Office (JPO) for Application No. 2017-227488, dated Jul. 2, 2019, 5 pgs.

\* cited by examiner

MOTOR DRIVING DEVICE AND MEASURING METHOD

CROSS-REFERENCE TO RELATED APPLICATION

This application is based upon and claims the benefit of priority from Japanese Patent Application No. 2017-227488 filed on Nov. 28, 2017, the contents of which are incorporated herein by reference.

BACKGROUND OF THE INVENTION

Field of the Invention

The present invention relates to a motor driving device and a measuring method for driving a plurality of motors and measuring insulation resistance of a plurality of motors.

Description of the Related Art

Japanese Laid-Open Patent Publication No. 2015-169479 discloses a motor driving device capable of measuring the insulation resistance of motors without being affected by leakage current flowing through semiconductor switching elements of inverter units.

SUMMARY OF THE INVENTION

In order to measure the insulation resistance (parasitic resistance) of the motor, it is necessary to wait for the current flowing through the insulation resistance to converge. Since the waiting time required for convergence varies depending on the magnitude of the parasitic capacitance of the motor, etc., the waiting time is set to a predetermined duration which is sufficiently long. However, if the waiting time is set in a single uniform way, there is a problem that the measurement time is unnecessarily lengthened even when the parasitic capacitance of a motor is small and the motor accordingly converges in a short time.

It is therefore an object of the present invention to provide a motor driving device and a measuring method that shortens the time required for measuring the insulation resistance of motors.

According to a first aspect of the present invention, a motor driving device for driving a plurality of motors includes: a rectifier circuit configured to rectify an AC voltage supplied from an AC power supply via a first switch to thereby obtain a DC voltage; a capacitor configured to smooth the DC voltage obtained by the rectifier circuit; a plurality of inverter units each including upper arm semiconductor switching elements configured to connect the positive-side terminal of the capacitor with motor coils of a corresponding one of the motors, and lower arm semiconductor switching elements configured to connect a negative-side terminal of the capacitor with the motor coils, the inverter units being configured to drive the multiple motors by converting the capacitor voltage across the capacitor into AC voltage by switching operation of the upper arm semiconductor switching elements and the lower arm semiconductor switching elements; a second switch configured to connect one terminal of the positive-side terminal and the negative-side terminal of the capacitor to ground; a first detector configured to detect a ground-referenced current flowing between the one terminal of the capacitor and the ground, or a ground-referenced voltage between the one terminal of the capacitor and the ground; a second detector configured to detect the capacitor voltage across the capacitor; a switch control unit configured to establish a measurement state for enabling measurement of an insulation resistance of a measurement target motor of the motors by turning off the upper arm semiconductor switching elements and the lower arm semiconductor switching elements of all the inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected; a convergence determination unit configured to, in the measurement state, calculate a change amount in the waveform of the ground-referenced current or the ground-referenced voltage detected by the first detector, and determine that the ground-referenced current or the ground-referenced voltage has converged if the change amount becomes equal to or lower than a threshold; and an insulation resistance calculator configured to, when the convergence determination unit determines that the ground-referenced current or the ground-referenced voltage has converged, calculate the insulation resistance of the measurement target motor, based on the ground-referenced current or the ground-referenced voltage detected by the first detector and the capacitor voltage detected by the second detector.

According to a second aspect of the present invention, a measuring method by which a motor driving device for driving a plurality of motors measures an insulation resistance of the motor. The motor driving device includes: a rectifier circuit configured to rectify an AC voltage supplied from an AC power supply via a first switch to a DC voltage; a capacitor configured to smooth the DC voltage rectified by the rectifier circuit; a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into AC voltage by switching operation of the upper arm semiconductor switching elements and the lower arm semiconductor switching elements; a second switch configured to connect one terminal of the positive-side terminal and the negative-side terminal of the capacitor to ground; a first detector configured to detect a ground-referenced current flowing between the one terminal of the capacitor and the ground, or a ground-referenced voltage between the one terminal of the capacitor and the ground; and a second detector configured to detect the capacitor voltage across the capacitor. The measuring method includes: a switch controlling step of establishing a measurement state for enabling measurement of the insulation resistance of a measurement target motor by turning off the upper arm semiconductor switching elements and the lower arm semiconductor switching elements of all the inverter units to thereby stop the operation of every motor while turning off the first switch and turning on the second switch, then turning on a semiconductor switching element that is connected to the other terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected; a convergence determining step of, in the measurement state, calculating a change amount in the waveform of the ground-referenced current or the ground-referenced voltage detected by the first detector, and determining that the ground-referenced current or the ground-referenced voltage has converged if the change amount becomes equal to or lower than a threshold; and an insulation resistance calculating step of, when the convergence determining step determines that the ground-referenced current or the ground-referenced voltage has converged, calculating the insulation resistance of the measurement target motor, based on the ground-referenced current or the ground-referenced voltage detected by the first detector and the capacitor voltage detected by the second detector.

According to the present invention, it is possible to shorten the time required for measuring the insulation resistance of the motor and prevent the time required for measurement of the insulation resistance from becoming longer than necessary.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A motor driving device and a measuring method according to the present invention will be detailed below by describing preferred embodiments with reference to the accompanying drawings.

Embodiment

<Overall Configuration of Motor Driving Device 10>

Figure 1:
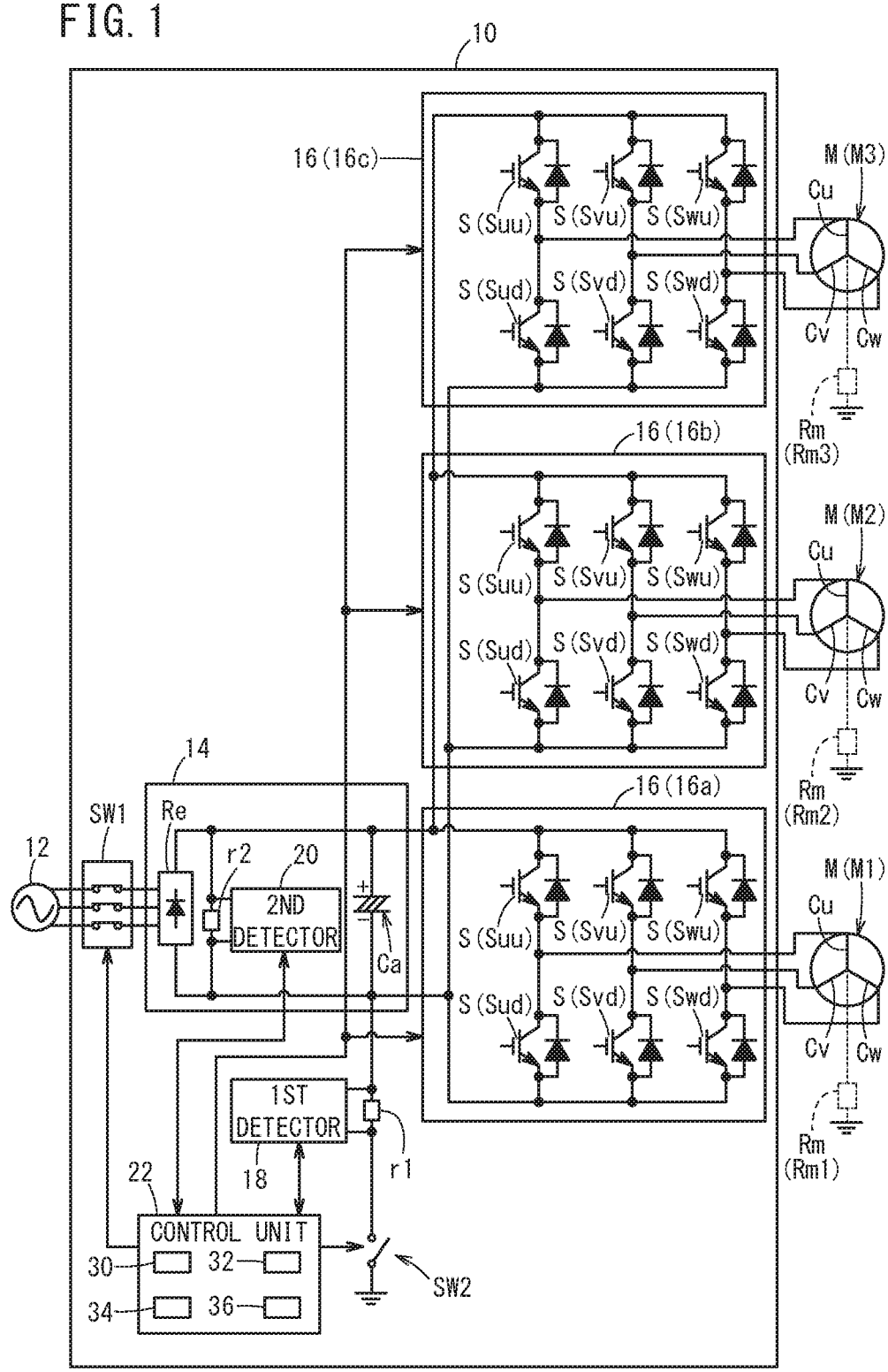
FIG. 1 is a diagram showing a configuration of a motor driving device according to an embodiment.

FIG. 1 is a diagram showing a configuration of a motor driving device 10 according to the embodiment. The motor driving device 10 drives a plurality of motors M. The motor driving device 10 includes a first switch SW1, a converter unit 14, a plurality of inverter units 16, a second switch SW2, a first detector 18, a second detector 20 and a control unit 22.

The first switch SW1 is a switch for turning on/off the supply of AC (alternating-current) voltage from an AC power supply 12.

The converter unit 14 converts the AC voltage supplied from the AC power supply 12 via the first switch SW1 into a DC (direct-current) voltage. The converter unit 14 includes a rectifier circuit Re for rectifying the AC voltage supplied from the AC power supply 12 through the first switch SW1 into a DC voltage, and a capacitor Ca for smoothing the DC voltage rectified by the rectifier circuit Re.

The multiple inverter units 16 convert the DC voltage (specifically, the voltage across the capacitor Ca) Vc converted by the converter unit 14 into AC voltage to thereby drive the multiple motors M.

In the present embodiment, in order to simplify the description, it is assumed that three motors M are provided, and the motor driving device 10 includes three inverter units 16 for driving the three motors M. In order to distinguish the three inverter units 16 from each other, the three inverter units 16 may be referred to as 16a, 16b, 16c, respectively. Further, there are cases where the motor M driven by the inverter unit 16a is denoted by M1, the motor M driven by the inverter unit 16b is denoted by M2, and the motor M driven by the inverter unit 16c is denoted by M3.

The resistance between the motor coils Cu, Cv, Cw of three phases (U, V, W) in each of the three motors M (M1 to M3) and the ground is called an insulation resistance (parasitic resistance) Rm. In order to distinguish these three insulation resistances Rm from each other, the insulation resistance Rm between the motor coils Cu, Cv, Cw of the motor M1 and the ground may be referred to as Rm1, the insulation resistance Rm between the motor coils Cu, Cv, Cw of the motor M2 and the ground may be referred to as Rm2, and the insulation resistance Rm between the motor coils Cu, Cv, Cw of the motor M3 and the ground may be referred to as Rm3.

Since the three inverter units 16 (16a, 16b, 16c) have the same configuration, only the configuration of the inverter unit 16a will be described. The inverter unit 16a has a plurality of semiconductor switching elements S. In the present embodiment, since the motor M used has three-phase (U, V, W) motor coils Cu, Cv, Cw, the multiple semiconductor switching elements S include an upper arm semiconductor switching element Suu and a lower arm semiconductor switching element Sud for the U-phase, an upper arm semiconductor switching element Svu and a lower arm semiconductor switching element Svd for the V-phase, and an upper arm semiconductor switching element Swu and a lower arm semiconductor switching element Swd for the W-phase.

The three-phase upper arm semiconductor switching elements Suu, Svu, Swu connect the positive terminal of the capacitor Ca with three-phase (U, V, W) motor coils Cu, Cv, Cw of the motor M1, respectively. The three-phase lower arm semiconductor switching elements Sud, Svd, Swd connect the negative terminal of the capacitor Ca with the three-phase motor coils Cu, Cv, Cw of the motor M1, respectively.

For each phase, the upper arm semiconductor switching element S and the lower arm semiconductor switching element S are connected in series, and the series of the upper arm semiconductor switching element S and the lower arm semiconductor switching element S, is connected in parallel to the capacitor Ca. Specifically, the series of U-phase semiconductor switching elements Suu and Sud is connected in parallel to the capacitor Ca. Similarly, the series of V-phase semiconductor switching elements Svu and Svd is connected in parallel to the capacitor Ca, and the series of W-phase semiconductor switching elements Swu and Swd is connected in parallel to the capacitor Ca.

The U-phase motor coil Cu of the motor M1 is connected to the emitter of the upper arm semiconductor switching element Suu and the collector of the lower arm semiconductor switching element Sud. The V-phase motor coil Cv of the motor M1 is connected to the emitter of the upper arm semiconductor switching element Svu and the collector of the lower arm semiconductor switching element Svd. The W-phase motor coil Cw of the motor M1 is connected to the emitter of the upper arm semiconductor switching element Swu and the collector of the lower arm semiconductor switching element Swd.

The inverter unit 16a performs switching operation (ON/OFF operation) on the three-phase upper arm semiconductor switching elements Suu, Svu, Swu and the three-phase lower arm semiconductor switching elements Sud, Svd, Swd to convert the voltage across the capacitor Ca (which will be referred to as the capacitor voltage Vc) into AC voltage to thereby drive the motor M1.

The second switch SW2 is a switch for connecting one terminal of the capacitor Ca (which is the terminal on the negative electrode side of the capacitor Ca in the present embodiment and will be referred as the first terminal) to the ground, in order to measure the insulation resistance Rm (Rm1, Rm2, Rm3).

The first detector 18 is a sensor for detecting the voltage (hereinafter referred to as the ground-referenced voltage Vm) between the first terminal of the capacitor Ca and the ground when the second switch SW2 is ON. A detection resistor r1 is connected in series with the second switch SW2 between the first terminal (the terminal on the negative electrode side) of the capacitor Ca and the ground. The first detector 18 detects the ground-referenced voltage Vm by measuring the voltage Vm across the detection resistor r1. Since the resistance value of the detection resistor r1 is known, the first detector 18 may detect the current flowing between the first terminal of the capacitor Ca and the ground (hereinafter referred to as the ground-referenced current Im), from the detected ground-referenced voltage Vm.

The second detector 20 is a sensor for detecting the capacitor voltage Vc between both terminals of the capacitor Ca. A detection resistor r2 is connected in parallel with the capacitor Ca. The second detector 20 detects the capacitor voltage Vc by measuring the voltage across the detection resistor r2.

The control unit 22 controls various components (the first switch SW1, the second switch SW2, the multiple semiconductor switching elements S, etc.) of the motor driving device 10 to drive the motors M (M1 to M3) and the like, and measures the insulation resistance Rm of motors M. The control unit 22 is made up of a processor such as a CPU, memory and others.

The control unit 22 selects one of the three motors M (M1 to M3) as a measurement target and measures the insulation resistance Rm of the selected motor M, i.e., the measurement target. Therefore, by switching to a motor M selected as the measurement target from among the motors M, it is possible to measure the insulation resistance Rm (Rm1 to Rm3) of all the motors M (M1 to M3).

The control unit 22 includes a measurement target selector 30, a switch control unit 32, a convergence determination unit 34, and an insulation resistance calculator 36.

The measurement target selector 30 selects one motor M as a measurement target. The motor M to be measured may be selected at random or based on a predetermined order. The measurement target selector 30 outputs information indicative of the motor M selected as the measurement target, to the switch control unit 32.

The switch control unit 32 performs on/off control of each of the first switch SW1, the second switch SW2 and the multiple semiconductor switching elements S. In measuring the insulation resistance Rm, the switch control unit 32 controls each of the first switch SW1, the second switch SW2 and the multiple semiconductor switching elements S so as to set up a measurement state for enabling measurement of the insulation resistance Rm of the motor M selected as the measurement target.

First, the switch control unit 32 turns off all the multiple semiconductor switching elements S (Suu, Svu, Swu, Sud, Svd, Swd) of each of the three inverter units 16 (16a to 16c), to thereby stop the operation of all the motors M (M1 to M3).

Then, the switch control unit 32 turns off the first switch SW1 and turns on the second switch SW2. Thus, the AC voltage from the AC power supply 12 is not supplied to the motor driving device 10 while the first terminal of the capacitor Ca (in this embodiment, the terminal on the negative electrode side of the capacitor Ca) is connected to the ground. As a result, the motor driving device 10 enters a measurement preparation state.

Figure 2:
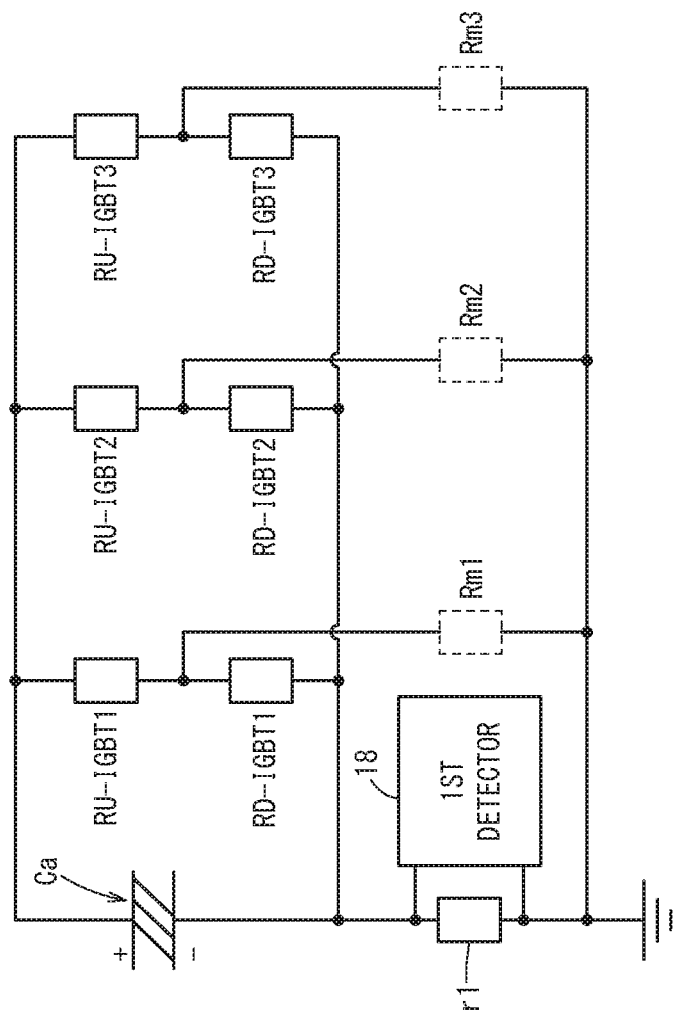
FIG. 2 is an equivalent circuit diagram showing, by using an equivalent circuit, the connection of the insulation resistance of motors when the motor driving device is in a measurement preparation state.

FIG. 2 is an equivalent circuit diagram of a state where the motor driving device 10 is set in the measurement preparation state (that is, all the multiple semiconductor switching elements S of every inverter unit 16 are turned off while the first switch SW1 is turned off and the second switch SW2 is turned on), showing the connection of the insulation resistances Rm (Rm1 to Rm3) of the motors M (M1 to M3) as an equivalent circuit.

Here, an RU-IGBT1 in FIG. 2 represents the equivalent insulation resistance of the three upper arm semiconductor switching elements Suu, Svu, Swu of the inverter unit 16a when they are in the off state. The RU-IGBT2 represents the equivalent insulation resistance of the three upper arm semiconductor switching elements Suu, Svu, and Swu of the inverter unit 16b when they are in the off state. The RU-IGBT3 represents the equivalent insulation resistance of the three upper arm semiconductor switching elements Suu, Svu, and Swu of the inverter unit 16c when they are in the off state. The equivalent insulation resistances RU-IGBT1, RU-IGBT2, and RU-IGBT3 are each the quotient obtained by dividing the voltage applied between the collector and the emitter of the three upper arm semiconductor switching elements Suu, Svu, Swu of the associated inverter unit 16a, 16b, 16c by the leakage current flowing from the collector to the emitter when they are in the off state.

On the other hand, the RD-IGBT1 shown in FIG. 2 represents the equivalent insulation resistance of the three lower arm semiconductor switching elements Sud, Svd, Swd of the inverter unit 16a when they are in the off state. The RD-IGBT2 represents the equivalent insulation resistance of the three lower arm semiconductor switching elements Sud, Svd, Swd of the inverter unit 16b when they are in the off state. The RD-IGBT3 represents the equivalent insulation resistance of the three lower arm semiconductor switching elements Sud, Svd, Swd of the inverter unit 16c when they are in the off state. The equivalent insulation resistances RD-IGBT1, RD-IGBT2 and RD-IGBT3 are each the quotient obtained by dividing the voltage applied between the collector and the emitter of the three lower arm semiconductor switching elements Sud, Svd, Swd of the associated inverter unit 16a, 16b, 16c by the leakage current flowing from the collector to the emitter when they are in the off state.

When putting the motor driving device 10 into the measurement preparation state, the switch control unit 32, based on the information indicative of a motor M selected as a measurement target by the measurement target selector 30, controls at least the semiconductor switching elements S of the inverter unit 16 that drives the motor M selected as the measurement target. This control will be described later in detail, but in short, the switch control unit 32 controls at least the semiconductor switching elements S of the inverter unit 16 that drives the measurement target motor M, so as to apply the capacitor voltage Vc across (so as to flow a current from capacitor Ca through) only the insulation resistance Rm of the measurement target motor M, of the insulation resistances Rm of the three motors M.

Thereby, the motor driving device 10 is placed in the measurement state that enables the insulation resistance Rm of the measurement target motor M. At this time, the ground-referenced voltage Vm is detected by the first detector 18. It should be noted that the first detector 18 may detect the ground-referenced current Im. This ground-referenced current Im is a current that flows through the insulation resistance Rm of the measurement target motor M when in the measurement state.

In the measurement state, the convergence determination unit 34 determines whether the ground-referenced voltage Vm or the ground-referenced current Im has converged, based on the ground-referenced voltage Vm, or the ground-referenced current Im, detected by the first detector 18. The convergence determination unit 34 will be detailed later.

The insulation resistance calculator 36 calculates the insulation resistance Rm, based on the ground-referenced voltage Vm or the ground-referenced current Im detected by the first detector 18, the capacitor voltage Vc detected by the second detector 20, and the detection resistor r1. The insulation resistance calculator 36 calculates the insulation resistance Rm after the convergence determination unit 34 has determined that the ground-referenced voltage Vm or the ground-referenced current Im has converged.

<Specific Control of Switch Control Unit 32>

Next, the control of the switch control unit 32 will be described in detail.

When putting the motor driving device 10 into the measurement preparation state, the switch control unit 32 controls the inverter unit 16 connected to the measurement target motor M selected by the measurement target selector 30, so that, among the multiple semiconductor switching elements S, at least one of the semiconductor switching elements S connected to the second terminal (the other terminal) of the capacitor Ca (i.e., the terminal opposite to the first terminal of the capacitor Ca connected to the ground through the second switch SW2) is turned on. Thereby, the motor coils Cu, Cv, Cw of the measurement target motor M have the same potential as the second terminal of the capacitor Ca.

In the present embodiment, since the terminal on the negative side of the capacitor Ca is adopted as the first terminal (one terminal), the switch control unit 32 may turn on at least one of the multiple upper arm semiconductor switching elements Suu, Svu, Swu of the inverter unit 16 connected to the motor M to be measured. As a result, the motor coils Cu, Cv, Cw of the motor M to be measured have the same potential as the positive terminal of the capacitor Ca. In this case, the semiconductor switching element S to be put into the ON state may be any of the U-phase, the V-phase and the W-phase semiconductor switching elements S, i.e., any of the multiple upper arm semiconductor switching elements Suu, Svu, Swu.

Figure 3:
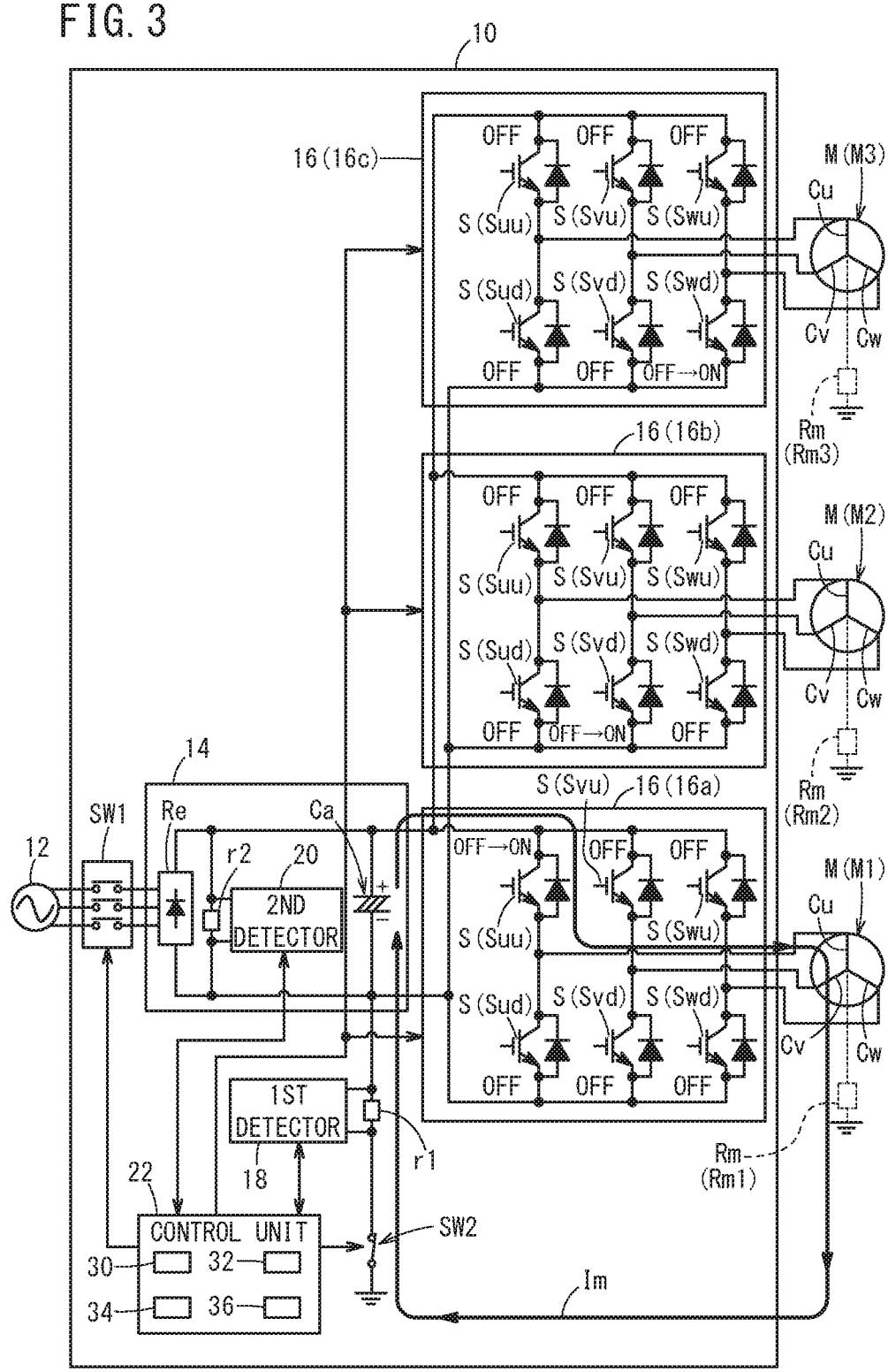
FIG. 3 is a diagram showing the flow of current when the motor driving device shown in FIG. 1 is in a measurement state.

In the example shown in FIG. 3, when the measurement target motor M is the motor M1, the U-phase upper arm semiconductor switching element Suu of the inverter unit 16a is placed in the ON state. With this configuration, for the inverter unit 16a connected to the measurement target motor M1, the capacitor Ca, the upper arm semiconductor switching element S in its ON state (the semiconductor switching element Suu in the example shown in FIG. 3), the insulation resistance Rm1 between the motor coils Cu, Cv, Cw of the measurement target motor M and the ground, and the detection resistor r1 jointly form a closed circuit.

Further, as to the inverter units 16 connected to the motors M other than the measurement target motor M selected by the measurement target selector 30, the switch control unit 32 turns on at least one of the multiple semiconductor switching elements S that are connected to the first terminal of the capacitors Ca (the capacitor Ca's terminal connected to the ground through the second switch SW2). As a result, all the motor coils Cu, Cv, Cw of the motors M other than the measurement target have the same potential as the first terminal of the capacitor Ca.

In the present embodiment, since the terminal on the negative side of the capacitor Ca is adopted as the first terminal, the switch control unit 32 only has to turn on at least one of the multiple lower arm semiconductor switching elements Sud, Svd, Swd of the inverter units 16 connected to the motors M other than the measurement target. As a result, the motor coils Cu, Cv, Cw of the motors M other than the measurement target have the same potential as the negative terminal of the capacitor Ca. In this case, the semiconductor switching element S to be put into the ON state may be any of the U-phase, the V-phase and the W-phase semiconductor switching elements S, that is, any of the multiple lower arm semiconductor switching elements Sud, Svd, Swd.

In the example shown in FIG. 3, the V-phase lower arm semiconductor switching element Svd of the inverter unit 16b is turned ON while the W-phase lower arm semiconductor switching element Swd of the inverter unit 16c is turned ON. This setting makes it possible to eliminate unnecessary current flowing through the detection resistor r1 via the motors M2 and M3 other than the measurement target.

Figure 4:
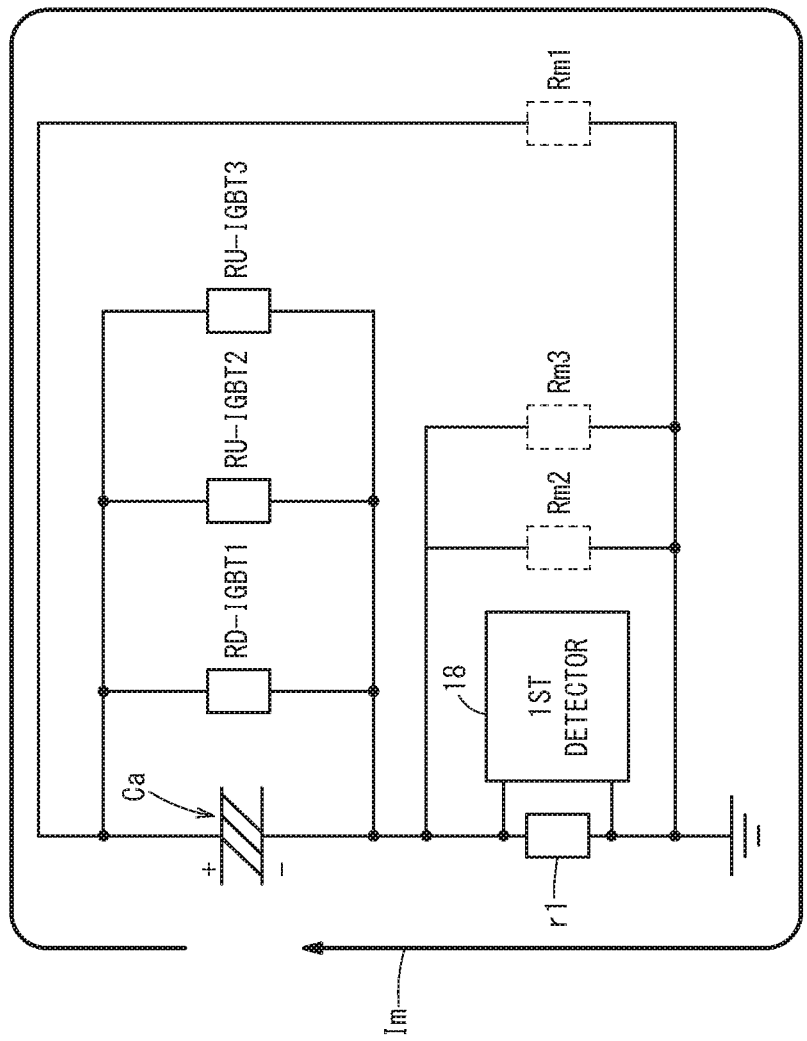
FIG. 4 is an equivalent circuit diagram showing the connection of the insulation resistance of the motor under a measurement state of the motor driving device shown in FIG. 1 using an equivalent circuit.

FIG. 4 is an equivalent circuit diagram showing an equivalent circuit where, in the equivalent circuit diagram shown in FIG. 2, the upper arm semiconductor switching element S of the inverter unit 16*a* for driving the measurement target motor M1 is turned on while the lower arm semiconductor switching elements S of the inverter units 16*b*, 16*c* for driving the motors M2, M3 other than the measurement target are turned on.

The equivalent circuit diagram of FIG. 4 is obtained by short-circuiting the equivalent insulation resistance RU-IGBT1 of the upper arm of the inverter unit 16*a*, the equivalent insulation resistance RD-IGBT2 of the lower arm of the inverter unit 16*b*, and the equivalent insulation resistance RD-IGBT3 of the lower arm of the inverter unit 16*c* in the equivalent circuit diagram of FIG. 2. As is apparent from FIG. 4, the equivalent insulation resistance RD-IGBT1 of the lower arm of the inverter unit 16*a*, the equivalent insulation resistance RU-IGBT2 of the upper arm of the inverter unit 16*b*, and the equivalent insulation resistance RU-IGBT3 of the upper arm of the inverter unit 16*c* are all connected to the positive terminal and the negative terminal of the capacitor Ca. Accordingly, leakage current flowing through these equivalent insulation resistors RD-IGBT1, RU-IGBT2 and RU-IGBT3 only flows from the terminal on the positive electrode side of the capacitor Ca to the terminal on the negative electrode side thereof, so that the leakage current does not flow through the detection resistor r1. Thus, it is understood that the measurement of the insulation resistance Rm1 of the measurement target motor M1 will not be affected at all. In other words, it is possible to consider that these equivalent insulation resistances RD-IGBT1, RU-IGBT2 and RU-IGBT3 do not exist when the insulation resistance Rm1 is measured.

At this time, the insulation resistances Rm2 and Rm3 of the motors M2 and M3 other than the measurement target are connected in parallel with the first detector 18. However, if the resistance of the detection resistor r1 is sufficiently smaller than the insulation resistances Rm2 and Rm3, the influence on the voltage detection and the current detection can be ignored. Therefore, it is possible to consider that the insulation resistances Rm2, Rm3 of the motors M2, M3 other than the measurement target do not exist when the insulation resistance Rm1 is measured. It is noted that measurement may be carried out by turning off all the lower arm semiconductor switching elements S so as to obtain the resistance value when the insulation resistances Rm (Rm1 to Rm3) of all the motors M (M1 to M3) are connected in parallel, and then the influence of Rm2 and Rm3 may be compensated by using the obtained resistance value.

Thus, it is possible to improve the accuracy with which the insulation resistance calculator 36 calculates the insulation resistance Rm of the measurement target motor M.

<Specific Determination Process of Convergence Determination Unit 34>

Next, the convergence determination unit 34 will be described in detail. The convergence determination unit 34 calculates the amount of change in the waveform of the ground-referenced voltage Vm or the ground-referenced current Im detected by the first detector 18, and when the amount of change is equal to or lower than a threshold, denoted at TH, the convergence determination unit 34 determines that the ground-referenced voltage Vm or the ground-referenced current Im has converged.

Since convergence determination is made in the same manner in both cases where the ground-referenced voltage Vm is used and the ground-referenced current Im is used, the following description will be given by taking examples where convergence determination is made based on the ground-referenced voltage Vm.

Figure 5:
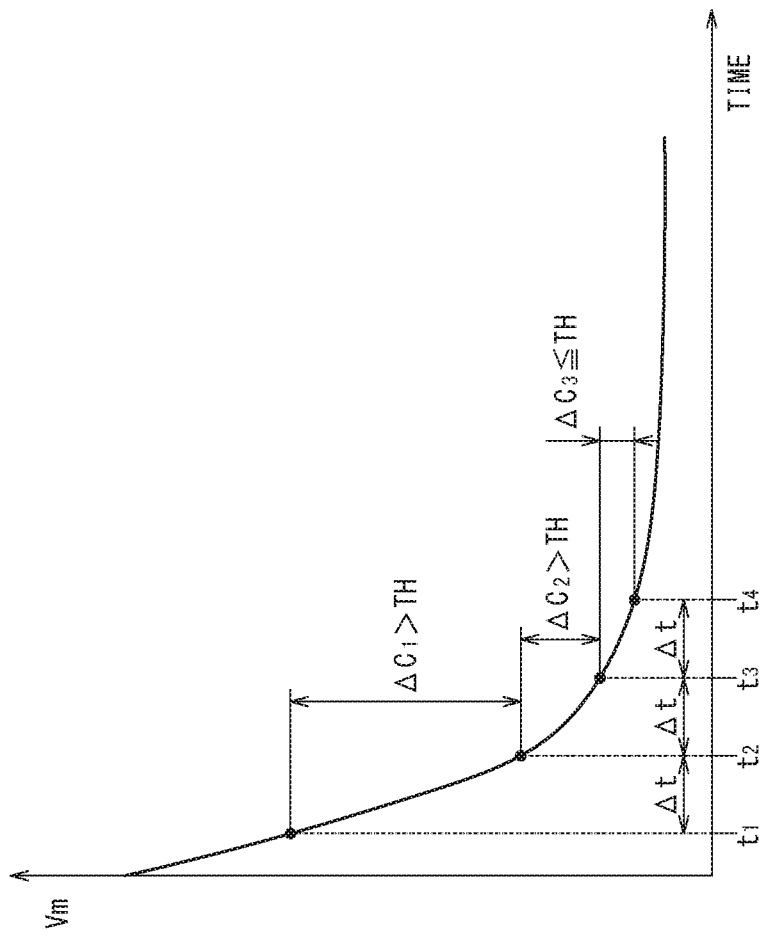
FIG. 5 is a waveform diagram showing an example of the relationship between the ground-referenced voltage and time in a measurement state, to explain the determination of a convergence determination unit using the first procedure.

FIG. 5 is a waveform diagram showing an example of the relationship between the ground-referenced voltage Vm detected by the first detector 18 and time. When the measurement state is brought about in which the insulation resistance Rm of the measurement target motor M can be measured, the ground-reference voltage Vm decreases with the passage of time after the voltage of the capacitor Ca has been applied across the detection resistor r1, and finally converges to a fixed value.

More specifically, the convergence determination unit 34 determines whether or not the ground-referenced voltage Vm has converged by using one of a plurality of procedures as described below.

<First Procedure>

In the first procedure, the convergence determination unit 34 uses the absolute value $\Delta C$ of the amount of change in the ground-referenced voltage Vm during a predetermined time $\Delta t$ (voltage change amount) as the change amount of the waveform of the ground-referenced voltage Vm. In this case, the convergence determination unit 34 calculates the change amount $\Delta C$ from the ground-referenced voltage Vm detected by the first detector 18 at intervals of the predetermined time $\Delta t$, and determines whether or not the change amount $\Delta C$ has become equal to or lower than a threshold TH.

In the example shown in FIG. 5, the time intervals between times $t_1$ and $t_2$, times $t_2$ and $t_3$, and times $t_3$ and $t_4$ are set to the predetermined time $\Delta t$. $\Delta C_1$ denotes the change amount $\Delta C$ during the time interval from $t_1$ and $t_2$, $\Delta C_2$ denotes the change amount $\Delta C$ during the time interval from $t_2$ to $t_3$, and $\Delta C_3$ denotes the change amount $\Delta C$ during the time interval from $t_3$ to $t_4$. In the example shown in FIG. 5, since the change amount $\Delta C_3$ of the ground-referenced voltage Vm during the time interval from times $t_3$ to $t_4$ is equal to or lower than the threshold TH, the convergence determination unit 34 can determine that the ground-referenced voltage Vm has converged at the time $t_4$.

In the example shown in FIG. 5, the predetermined time $\Delta t$ is set to a fixed time, but the length of the predetermined time $\Delta t$ may be lengthened with the passage of time. The reason for this is that since the change amount $\Delta C$ of the waveform of the ground-referenced voltage Vm becomes smaller with the passage of time, if the predetermined time $\Delta t$ is set to a fixed time, the change amount $\Delta C$ becomes smaller toward the convergence, so that it becomes more difficult to measure the change amount $\Delta C$ accurately, which may degrade the determination accuracy. In addition, the threshold value TH may be made greater depending on the length of the predetermined time $\Delta t$.

<Second Procedure>

In the second procedure, when the absolute value of the amount of change in the ground-referenced voltage Vm during the predetermined time $\Delta t$ is $\Delta C$, the convergence determination unit 34 calculates $\Delta C/\Delta t$ as the change amount of the waveform of the ground-referenced voltage Vm. In this case, the convergence determination unit 34 calculates the change amount $\Delta C/\Delta t$ from the ground-referenced voltage Vm detected by the first detector 18 at intervals of the predetermined time $\Delta t$ and determines whether or not the change amount $\Delta C/\Delta t$ is equal to or lower than a threshold TH. Similarly, when it is assumed in the second method that the change amount $\Delta C/\Delta t$ of the ground-referenced voltage Vm during the time interval from time $t_3$ to time $t_4$ is equal to or lower than the threshold TH, the convergence determination unit 34 determines that the voltage Vm has converged at time $t_4$.

Similarly to the case of the first procedure, the length of the predetermined time Δt may be lengthened with the lapse of time.

<Third Procedure>

In the third procedure, the convergence determination unit 34 calculates a derivative value Dv (the slope of a tangent line) of the waveform of the ground-referenced voltage Vm, and takes the absolute value ΔC of the derivative value Dv (the absolute value of the slope), as the change amount. In this case, the convergence determination unit 34 calculates the derivative value Dv from the ground-referenced voltage Vm detected by the first detector 18 and determines whether or not the absolute value ΔC of the derivative value Dv has become equal to or lower than a threshold TH.

Figure 6:
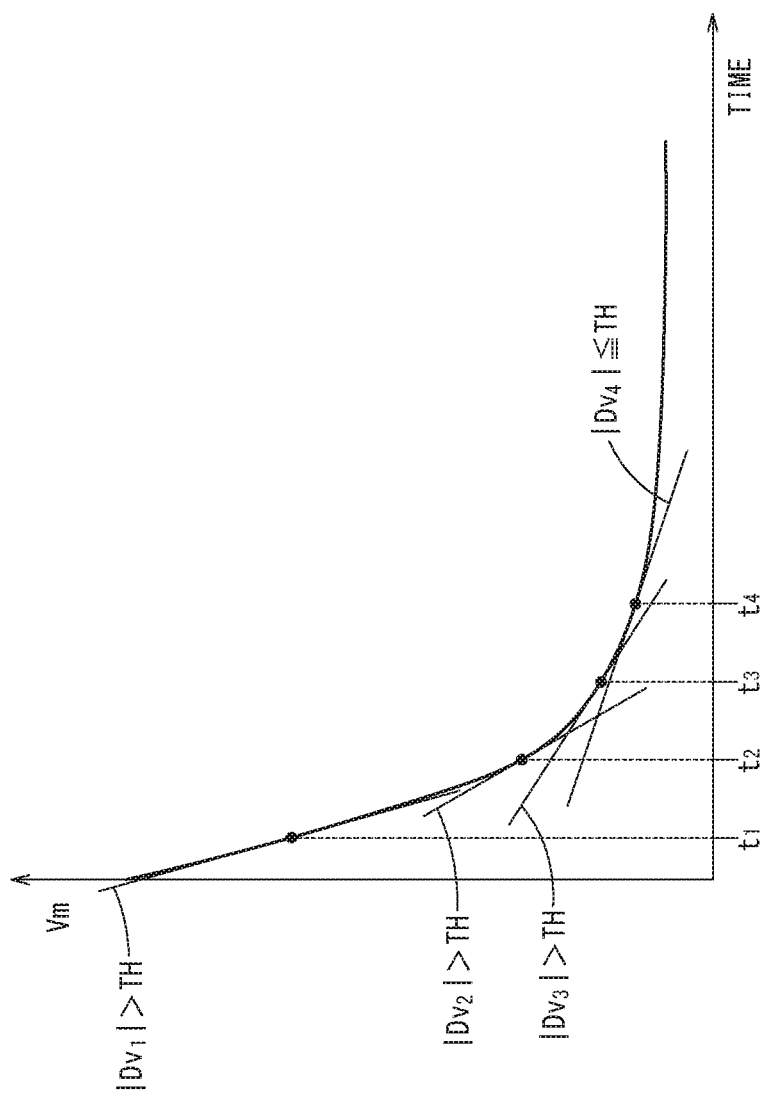
FIG. 6 is a waveform diagram showing an example of the relationship between the ground-referenced voltage and time in a measurement state, to explain the determination of a convergence determination unit using the third procedure.

FIG. 6 is a diagram showing derivative values (slopes) $Dv_1$ to $Dv_4$ at detection times $t_1$ to $t_4$ at which the ground-referenced voltage Vm is detected. $Dv_1$ denotes the derivative value (slope) Dv at detection time $t_1$, $Dv_2$ denotes the derivative value Dv at detection time $t_2$, $Dv_3$ denotes the derivative value Dv at detection time $t_3$, and $Dv_4$ denotes the derivative value Dv at detection time $t_4$. As shown in FIG. 6, the magnitude (absolute value ΔC) of the derivative value (slope) Dv gradually decreases with the passage of time (i.e., as the voltage approaches the convergence state). In the example shown in FIG. 6, since the absolute value ΔC of the derivative value $Dv_4$ is equal to or smaller than the threshold TH at detection time $t_4$, the convergence determination unit 34 can determine that the ground-referenced voltage Vm has converged at detection time $t_4$.

<Fourth Procedure>

In the fourth procedure, the convergence determination unit 34 regards the change amount of the waveform of the ground-referenced voltage Vm as having become equal to or lower than a threshold TH if the change amount of the ground-referenced voltage Vm does not exceed a reference change amount ΔCs after the elapse of a predetermined time T, and then determines that the ground-referenced voltage Vm has converged. As shown in FIG. 5, since the ground-referenced voltage Vm gradually decreases with the passage of time, the time required for the ground-referenced voltage Vm to change by the reference change amount ΔCs becomes longer as time passes, as shown in FIG. 7.

Figure 7:
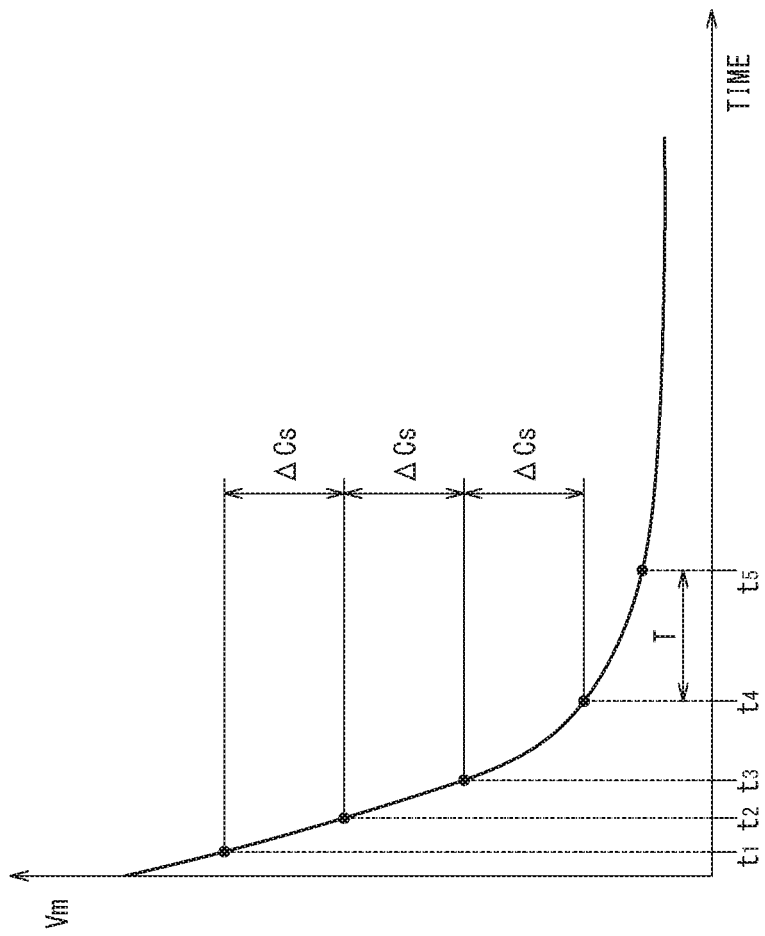
FIG. 7 is a waveform diagram showing an example of the relationship between the ground-referenced voltage and time in a measurement state, to explain the determination of a convergence determination unit using the fourth procedure.

In the example shown in FIG. 7, the time interval from $t_1$ to $t_2$, the time interval from $t_2$ to $t_3$, and the time interval from $t_3$ to $t_4$ each indicate a time required for the ground-referenced voltage Vm to change by the reference change amount ΔCs. For example, the time $t_2$ is a time point at which the ground-referenced voltage Vm of the time $t_1$ decreases by the reference change amount ΔCs, and the time $t_3$ is a time point at which the ground-referenced voltage Vm of the time $t_2$ decreases by the reference change amount ΔCs. In the example shown in FIG. 7, the ground-referenced voltage Vm of the time $t_4$ does not change by the reference change amount ΔCs or greater even after the lapse of the predetermined time T, so that the convergence determination unit 34 determines at the time $t_5$, i.e., when the predetermined time T has elapsed from the time $t_4$, that the ground-referenced voltage Vm has converged.

In the present embodiment, whether or not the ground-referenced voltage Vm has converged is determined as above, and when it is determined that the ground-referenced voltage Vm has converged, the insulation resistance Rm is measured. Accordingly, it is possible to shorten the waiting time from when the measurement state is brought about until when measuring of the insulation resistance Rm is started. Therefore, the time required for measuring the insulation resistance Rm of the motor M can be shortened.

The ground-referenced current Im is the quotient obtained by dividing the ground-referenced voltage Vm by the resistance of the detection resistor r1, which is a known predetermined constant value. Therefore, if the ground-referenced voltage Vm is replaced with the resistance of the detection resistor r1×the ground-referenced current Im, it is possible to determine the convergence based on the ground-referenced current Im.

<Operation of Motor Driving Device 10>

Figure 8:
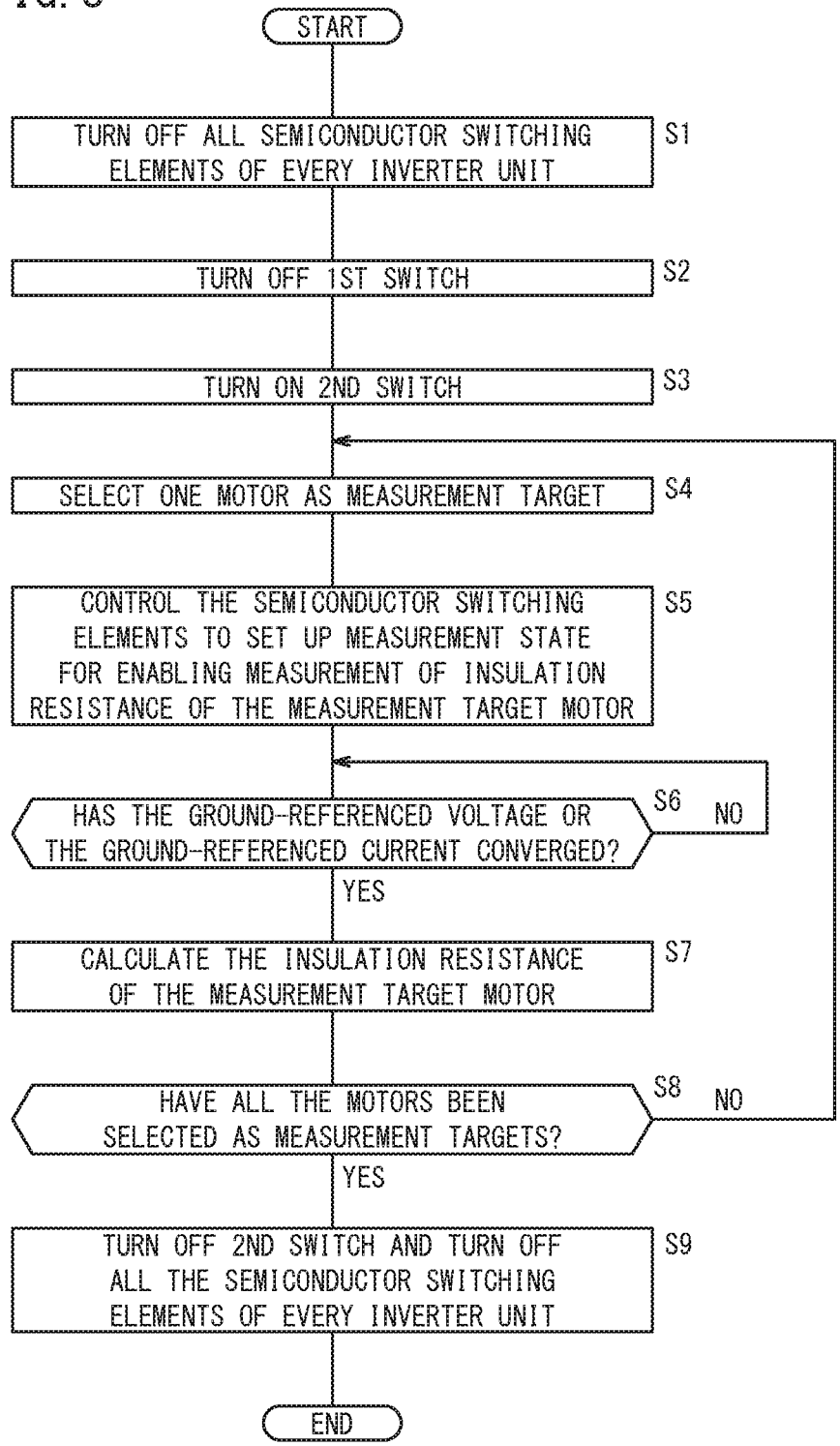
FIG. 8 is a flowchart showing how the motor driving device performs a measuring operation of insulation resistance.

Next, the operation of the motor driving device 10 to measure the insulation resistance Rm will be described with reference to the flowchart shown in FIG. 8. At step S1, the switch control unit 32 turns off all the multiple semiconductor switching elements S (Suu, Svu, Swu, Sud, Svd, Swd) of every inverter unit 16 (16a, 16b, 16c). As a result, operation of all the motors M (M1 to M3) is stopped.

Next, at step S2, the switch control unit 32 turns off the first switch SW1. As a result, the supply of the AC voltage from the AC power supply 12 to the motor driving device 10 is shut off.

Then, at step S3, the switch control unit 32 turns on the second switch SW2. This creates a state in which the negative side terminal (the first terminal) of the capacitor Ca is connected to the ground. As a result, the motor driving device 10 enters the measurement preparation state, which is represented by the equivalent circuit in FIG. 2.

At step S4, the measurement target selector 30 selects one of the motors M (M1 to M3) as a measurement target. At this time, the measurement target selector 30 selects a motor M which has not yet been selected as the measurement target.

Next, at step S5, the switch control unit 32 controls the semiconductor switching elements S of the multiple inverter units 16 (16a, 16b, 16c) so as to set up the measurement state in which the insulation resistance Rm of the measurement target motor M selected at step S4 can be measured.

Specifically, with regard to the inverter unit 16 connected to the motor M to be measured, the switch control unit 32 turns on one of the upper arm semiconductor switching elements S connected to the positive terminal (the second terminal) of the capacitor Ca. Further, with regard to the inverter units 16 connected to the motors M other than the measurement target motor, the switch control unit 32 turns on one of the lower arm semiconductor switching elements S connected to the negative terminal (the first terminal) of the capacitor Ca. As a result, when, for example, the motor M1 is the measurement target motor M, the equivalent circuit shown in FIG. 2 is changed into the state as shown in FIG. 4. Therefore, the current from the capacitor Ca flows through the insulation resistance Rm1 of the measurement target motor M1 and the detection resistor r1, and returns to the capacitor Ca.

Next, at step S6 the convergence determination unit 34 determines whether or not the ground-referenced voltage Vm or the ground-referenced current Im detected by the first detector 18 has converged. Specifically, when the amount of change in the waveform of the ground-referenced voltage Vm or the ground-referenced current Im, detected by the first detector 18 becomes equal to or lower than the threshold TH, the convergence determination unit 34 determines that the ground-referenced voltage Vm or the ground-referenced current Im has converged. The convergence determination unit 34 may use one of the first to fourth procedures to determine the convergence of the ground-referenced voltage Vm or the ground-referenced current Im.

If it is determined at step S6 that the ground-referenced voltage Vm or the ground-referenced current Im has not yet converged, the control stays at step S6 until it is determined that convergence has occurred, and the ground-referenced voltage Vm or the ground-referenced current Im is determined to have converged, the control proceeds to step S7.

At step S7, the insulation resistance calculator 36 calculates the insulation resistance Rm of the measurement target motor M1, based on the ground-referenced voltage Vm or the ground-referenced current Im detected by the first detector 18 and the capacitor voltage Vc detected by the second detector 20. The insulation resistance calculator 36 calculates the insulation resistance Rm, based on the ground-referenced voltage Vm or the ground-referenced current Im and the capacitor voltage Vc at the time when or after it is determined that it has converged.

Next, at step S8, the measurement target selector 30 determines whether or not all the motors M have been selected as measurement targets. That is, the measurement target selector 30 determines whether there is still any motor M not selected as a measurement target. If it is determined at step S8 that not all the motors M have been selected as measurement targets, that is, if there is a motor M that has not yet been selected as a measurement target, the control returns to step S4.

If it is determined at step S8 that all the motors M have been selected as measurement targets, the control proceeds to step S9, in which the switch control unit 32 turns off the second switch SW2, and also turns off all the multiple semiconductor switching elements S of every inverter unit 16 (16a to 16c). As a result, the measurement operation is terminated.

Modified Example

In the above description of the embodiment, the negative terminal of the capacitor Ca is taken as the first terminal, but the positive terminal of the capacitor Ca may be adopted as the first terminal. In this case, the positive terminal of the capacitor Ca is connected to the ground via the second switch SW2 while the detection resistor r1 is connected in series with the second switch SW2 between the positive terminal (the first terminal) of the capacitor Ca and the ground. Also in this case, the insulation resistance Rm of the motor M can be measured.

Technical Idea Obtained from Embodiment

Technical ideas that can be grasped from the above embodiment and modifications are described below.
<First Technical Idea>

The motor driving device (10) for driving a plurality of motors (M) includes: a rectifier circuit (Re) configured to rectify an AC voltage supplied from an AC power supply (12) via a first switch (SW1) to thereby obtain a DC voltage; a capacitor (Ca) configured to smooth the DC voltage obtained by the rectifier circuit (Re); a plurality of inverter units (16) each including upper arm semiconductor switching elements (S) configured to connect the positive-side terminal of the capacitor (Ca) with motor coils (Cu, Cv, Cw) of a corresponding one of the motors (M), and lower arm semiconductor switching elements (S) configured to connect the negative-side terminal of the capacitor (Ca) with the motor coils (Cu, Cv, Cw), the inverter units being configured to drive the multiple motors (M) by converting the capacitor voltage (Vc) across the capacitor (Ca) into AC voltage by switching operation of the upper arm semiconductor switching elements (S) and the lower arm semiconductor switching elements (S); a second switch (SW2) configured to connect one terminal (first terminal) of the positive-side terminal and the negative-side terminal of the capacitor (Ca) to the ground; a first detector (18) configured to detect a ground-referenced current (Im) flowing between the one terminal of the capacitor (Ca) and the ground, or a ground-referenced voltage (Vm) between the one terminal of the capacitor (Ca) and the ground; a second detector (20) configured to detect the capacitor voltage (Vc) across the capacitor (Ca); a switch control unit (32) configured to establish a measurement state for enabling measurement of the insulation resistance (Rm) of a measurement target motor (M) of the motors by turning off the upper arm semiconductor switching elements (S) and the lower arm semiconductor switching elements (S) of all the multiple inverter units (16) to thereby stop operation of every motor (M) while turning off the first switch (SW1) and turning on the second switch (SW2), then turning on a semiconductor switching element (S) that is connected to the other terminal (second terminal) of the capacitor (Ca), among the upper arm and lower arm semiconductor switching elements (S) to which the motor coils (Cu, Cv, Cw) of the measurement target motor (M) are connected, and turning on a semiconductor switching element (S) that is connected to the one terminal of the capacitor (Ca), among the upper arm and lower arm semiconductor switching elements (S) to which the motor coils (Cu, Cv, Cw) of each of the motors (M) other than measurement target motor (M) are connected; a convergence determination unit (34) configured to, in the measurement state, calculate a change amount in the waveform of the ground-referenced current (Im) or the ground-referenced voltage (Vm) detected by the first detector (18), and determine that the ground-referenced current (Im) or the ground-referenced voltage (Vm) has converged if the change amount becomes equal to or lower than a threshold (TH); and an insulation resistance calculator (36) configured to, when the convergence determination unit (34) determines that the ground-referenced current or the ground-referenced voltage has converged, calculate the insulation resistance (Rm) of the measurement target motor (M), based on the ground-referenced current (Im) or the ground-referenced voltage (Vm) detected by the first detector (18) and the capacitor voltage (Vc) detected by the second detector (20).

With the above configuration, it is possible to shorten the time required for measuring the insulation resistance (Rm) of the motor (M) and prevent the time required for measurement of the insulation resistance (Rm) from becoming longer than necessary.

The convergence determination unit (34) may use, as the change amount, the absolute value $\Delta C$ of the amount of change in the ground-referenced current (Im) or the ground-referenced voltage (Vm) during the predetermined time $\Delta t$. This makes it possible to accurately determine if the ground-referenced current (Im) or the ground-referenced voltage (Vm) has converged.

The convergence determination unit (34) may use $\Delta C/\Delta t$ as the change amount when $\Delta C$ is the absolute value of the amount of change in the ground-referenced current (Im) or the ground-referenced voltage (Vm) during the predetermined time $\Delta t$. This makes it possible to accurately determine if the ground-referenced current (Im) or the ground-referenced voltage (Vm) has converged.

The convergence determination unit (34) may gradually lengthen the predetermined time $\Delta t$ with the lapse of time. This makes it possible to accurately determine if the ground-referenced current (Im) or the ground-referenced voltage (Vm) has converged.

The convergence determination unit (34) may use, as the change amount, the absolute value ($\Delta C$) of the derivative value (Dv) of the waveform of the ground-referenced current (Im) or the ground-referenced voltage (Vm). This makes it possible to accurately determine if the ground-referenced current (Im) or the ground-referenced voltage (Vm) has converged.

The convergence determination unit (34) may determine that the ground-referenced current or the ground-referenced voltage has converged if the ground-referenced current (Im) or the ground-referenced voltage (Vm) has not changed by the reference change amount (ΔCs) even after the passage of a predetermined time (T). This makes it possible to accurately determine if the ground-referenced current (Im) or the ground-referenced voltage (Vm) has converged.

<Second Technical Idea>

The second technical idea offers a measuring method by which a motor driving device (10) for driving a plurality of motors (M) measures the insulation resistance (Rm) of the motor (M). The motor driving device (10) includes: a rectifier circuit (Re) configured to rectify an AC voltage supplied from an AC power supply (12) via a first switch (SW1) to a DC voltage; a capacitor (Ca) configured to smooth the DC voltage rectified by the rectifier circuit (Re); a plurality of inverter units (16) each including upper arm semiconductor switching elements (S) configured to connect the positive-side terminal of the capacitor (Ca) with motor coils (Cu, Cv, Cw) of a corresponding one of the motors (M), and lower arm semiconductor switching elements (S) configured to connect the negative-side terminal of the capacitor (Ca) with the motor coils (Cu, Cv, Cw), the inverter units being configured to drive the multiple motors (M) by converting the capacitor voltage (Vc) across the capacitor (Ca) into AC voltage by switching operation of the upper arm semiconductor switching elements (S) and the lower arm semiconductor switching elements (S); a second switch (SW2) configured to connect one terminal of the positive-side and the negative-side terminal of the capacitor (Ca) to the ground; a first detector (18) configured to detect a ground-referenced current (Im) flowing between the one terminal of the capacitor (Ca) and the ground, or a ground-referenced voltage (Vm) between the one terminal of the capacitor (Ca) and the ground; and a second detector (20) configured to detect the capacitor voltage (Vc) across the capacitor (Ca). The measuring method includes: a switch controlling step of establishing a measurement state for enabling measurement of the insulation resistance (Rm) of a measurement target motor (M) by turning off the upper arm semiconductor switching elements (S) and the lower arm semiconductor switching elements (S) of all the multiple inverter units (16) to thereby stop the operation of every motor (M) while turning off the first switch (SW1) and turning on the second switch (SW2), then turning on a semiconductor switching element (S) that is connected to the other terminal of the capacitor (Ca), among the upper arm and lower arm semiconductor switching elements (S) to which the motor coils (Cu, Cv, Cw) of the measurement target motor (M) are connected, and turning on a semiconductor switching element (S) that is connected to the one terminal of the capacitor (Ca), among the upper arm and lower arm semiconductor switching elements (S) to which the motor coils (Cu, Cv, Cw) of each of the motors (M) other than the measurement target motor (M) are connected; a convergence determining step of, in the measurement state, calculating a change amount in the waveform of the ground-referenced current (Im) or the ground-referenced voltage (Vm) detected by the first detector (18), and determining that the ground-referenced current (Im) or the ground-referenced voltage (Vm) has converged if the change amount becomes equal to or lower than a threshold (TH); and an insulation resistance calculating step of, when the convergence determining step determines that the ground-referenced current (Im) or the ground-referenced voltage (Vm) has converged, calculating the insulation resistance (Rm) of the measurement target motor (M), based on the ground-referenced current (Im) or the ground-referenced voltage (Vm) detected by the first detector (18) and the capacitor voltage (Vc) detected by the second detector (20).

With this configuration, it is possible to shorten the time required for measuring the insulation resistance (Rm) of the motor (M) and prevent the time required for measurement of the insulation resistance (Rm) from becoming longer than necessary.

The convergence determining step may use, as the change amount, the absolute value ΔC of the amount of change in the ground-referenced current (Im) or the ground-referenced voltage (Vm) during the predetermined time Δt. This makes it possible to accurately determine if the ground-referenced current (Im) or the ground-referenced voltage (Vm) has converged.

When ΔC is the absolute value of the amount of change in the ground-referenced current (Im) or the ground-referenced voltage (Vm) during the predetermined time Δt, the convergence determining step may use ΔC/Δt as the change amount. This makes it possible to accurately determine if the ground-referenced current (Im) or the ground-referenced voltage (Vm) has converged.

The convergence determining step may gradually lengthen the predetermined time Δt with the lapse of time. This makes it possible to accurately determine if the ground-referenced current (Im) or the ground-referenced voltage (Vm) has converged.

The convergence determining step may use, as the change amount, the absolute value (ΔC) of the derivative value (Dv) of the waveform of the ground-referenced current (Im) or the ground-referenced voltage (Vm). This makes it possible to accurately determine if the ground-referenced current (Im) or the ground-referenced voltage (Vm) has converged.

The convergence determining step may determine that the ground-referenced current or the ground-referenced voltage has converged if the ground-referenced current (Im) or the ground-referenced voltage (Vm) has not changed by the reference change amount (ΔCs) even after the passage of a predetermined time (T). This makes it possible to accurately determine if the ground-referenced current (Im) or the ground-referenced voltage (Vm) has converged.

The present invention is not particularly limited to the embodiments described above, and various modifications are possible without departing from the essence and gist of the present invention.

What is claimed is:

1. A motor driving device for driving a plurality of motors, comprising:
   a rectifier circuit configured to rectify an AC voltage supplied from an AC power supply via a first switch to thereby obtain a DC voltage;
   a capacitor configured to smooth the DC voltage obtained by the rectifier circuit;
   a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into an AC voltage by switching operation of the upper arm semiconductor switching elements and the lower arm semiconductor switching elements;
a second switch configured to connect one terminal of the positive-side terminal and the negative-side terminal of the capacitor to ground;
a first detector configured to detect a ground-referenced current flowing between the one terminal of the capacitor and the ground, or a ground-referenced voltage between the one terminal of the capacitor and the ground;
a second detector configured to detect the capacitor voltage across the capacitor;
a switch control unit configured to establish a measurement state for enabling measurement of an insulation resistance of a measurement target motor of the motors by turning off the upper arm semiconductor switching elements and the lower arm semiconductor switching elements of all the inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected;
a convergence determination unit configured to, in the measurement state, calculate a change amount in a waveform of the ground-referenced current or the ground-referenced voltage detected by the first detector, and determine that the ground-referenced current or the ground-referenced voltage has converged if the change amount becomes equal to or lower than a threshold; and
an insulation resistance calculator configured to, when the convergence determination unit determines that the ground-referenced current or the ground-referenced voltage has converged, calculate the insulation resistance of the measurement target motor, based on the ground-referenced current or the ground-referenced voltage detected by the first detector and the capacitor voltage detected by the second detector,
wherein
the convergence determination unit uses, as the change amount, an absolute value $\Delta C$ of an amount of change in the ground-referenced current or the ground-referenced voltage during a predetermined time $\Delta t$, and
the convergence determination unit gradually lengthens the predetermined time $\Delta t$ with lapse of time.

2. A motor driving device for driving a plurality of motors, comprising:
a rectifier circuit configured to rectify an AC voltage supplied from an AC power supply via a first switch to thereby obtain a DC voltage;
a capacitor configured to smooth the DC voltage obtained by the rectifier circuit;
a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into an AC voltage by switching operation of the upper arm semiconductor switching elements and the lower arm semiconductor switching elements;
a second switch configured to connect one terminal of the positive-side terminal and the negative-side terminal of the capacitor to ground;
a first detector configured to detect a ground-referenced current flowing between the one terminal of the capacitor and the ground, or a ground-referenced voltage between the one terminal of the capacitor and the ground;
a second detector configured to detect the capacitor voltage across the capacitor;
a switch control unit configured to establish a measurement state for enabling measurement of an insulation resistance of a measurement target motor of the motors by turning off the upper arm semiconductor switching elements and the lower arm semiconductor switching elements of all the inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected;
a convergence determination unit configured to, in the measurement state, calculate a change amount in a waveform of the ground-referenced current or the ground-referenced voltage detected by the first detector, and determine that the ground-referenced current or the ground-referenced voltage has converged if the change amount becomes equal to or lower than a threshold; and
an insulation resistance calculator configured to, when the convergence determination unit determines that the ground-referenced current or the ground-referenced voltage has converged, calculate the insulation resistance of the measurement target motor, based on the ground-referenced current or the ground-referenced voltage detected by the first detector and the capacitor voltage detected by the second detector,
wherein, when $\Delta C$ is an absolute value of an amount of change in the ground-referenced current or the ground-referenced voltage during a predetermined time $\Delta t$, the convergence determination unit uses $\Delta C/\Delta t$ as the change amount, and
the convergence determination unit gradually lengthens the predetermined time $\Delta t$ with lapse of time.

3. A measuring method by which a motor driving device for driving a plurality of motors measures an insulation resistance of the motor, wherein,
the motor driving device includes:
a rectifier circuit configured to rectify an AC voltage supplied from an AC power supply via a first switch to thereby obtain a DC voltage;
a capacitor configured to smooth the DC voltage obtained by the rectifier circuit;

a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into an AC voltage by switching operation of the upper arm semiconductor switching elements and the lower arm semiconductor switching elements;

a second switch configured to connect one terminal of the positive-side terminal and the negative-side terminal of the capacitor to ground;

a first detector configured to detect a ground-referenced current flowing between the one terminal of the capacitor and the ground, or a ground-referenced voltage between the one terminal of the capacitor and the ground; and a second detector configured to detect the capacitor voltage across the capacitor, the measuring method comprising:

a switch controlling step of establishing a measurement state for enabling measurement of the insulation resistance of a measurement target motor of the motors by turning off the upper arm semiconductor switching elements and the lower arm semiconductor switching elements of all the inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected;

a convergence determining step of, in the measurement state, calculating a change amount in a waveform of the ground-referenced current or the ground-referenced voltage detected by the first detector, and determining that the ground-referenced current or the ground-referenced voltage has converged if the change amount becomes equal to or lower than a threshold; and an insulation resistance calculating step of, when the convergence determining step determines that the ground-referenced current or the ground-referenced voltage has converged, calculating the insulation resistance of the measurement target motor, based on the ground-referenced current or the ground-referenced voltage detected by the first detector and the capacitor voltage detected by the second detector, wherein the convergence determining step uses, as the change amount, an absolute value $\Delta C$ of an amount of change in the ground-referenced current or the ground-referenced voltage during a predetermined time $\Delta t$, and the convergence determining step gradually lengthens the predetermined time $\Delta t$ with lapse of time.

4. A measuring method by which a motor driving device for driving a plurality of motors measures an insulation resistance of the motor, wherein, the motor driving device includes:

a rectifier circuit configured to rectify an AC voltage supplied from an AC power supply via a first switch to thereby obtain a DC voltage;

a capacitor configured to smooth the DC voltage obtained by the rectifier circuit;

a plurality of inverter units each including upper arm semiconductor switching elements configured to connect a positive-side terminal of the capacitor with motor coils of a corresponding one of the motors, and lower arm semiconductor switching elements configured to connect a negative-side terminal of the capacitor with the motor coils, the inverter units being configured to drive the motors by converting a capacitor voltage across the capacitor into an AC voltage by switching operation of the upper arm semiconductor switching elements and the lower arm semiconductor switching elements;

a second switch configured to connect one terminal of the positive-side terminal and the negative-side terminal of the capacitor to ground;

a first detector configured to detect a ground-referenced current flowing between the one terminal of the capacitor and the ground, or a ground-referenced voltage between the one terminal of the capacitor and the ground; and a second detector configured to detect the capacitor voltage across the capacitor, the measuring method comprising:

a switch controlling step of establishing a measurement state for enabling measurement of the insulation resistance of a measurement target motor of the motors by turning off the upper arm semiconductor switching elements and the lower arm semiconductor switching elements of all the inverter units to thereby stop operation of every motor while turning off the first switch and turning on the second switch, then turning on a semiconductor switching element that is connected to another terminal of the capacitor, among the upper arm and lower arm semiconductor switching elements to which the motor coils of the measurement target motor are connected, and turning on a semiconductor switching element that is connected to the one terminal of the capacitor, among the upper arm and lower arm semiconductor switching elements to which the motor coils of each of the motors other than the measurement target motor are connected;

a convergence determining step of, in the measurement state, calculating a change amount in a waveform of the ground-referenced current or the ground-referenced voltage detected by the first detector, and determining that the ground-referenced current or the ground-referenced voltage has converged if the change amount becomes equal to or lower than a threshold; and an insulation resistance calculating step of, when the convergence determining step determines that the ground-referenced current or the ground-referenced voltage has converged, calculating the insulation resistance of the measurement target motor, based on the ground-referenced current or the ground-referenced voltage detected by the first detector and the capacitor voltage detected by the second detector, wherein, when $\Delta C$ is an absolute value of an amount of change in the ground-referenced current or the ground-referenced voltage during a predetermined time $\Delta t$, the convergence determining step uses $\Delta C/\Delta t$ as the change amount, and the convergence determining step gradually lengthens the predetermined time $\Delta t$ with lapse of time.

* * * * *